(12) United States Patent
Yu

(10) Patent No.: US 6,472,282 B1
(45) Date of Patent: Oct. 29, 2002

(54) SELF-AMORPHIZED REGIONS FOR TRANSISTORS

(75) Inventor: Bin Yu, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/639,380

(22) Filed: Aug. 15, 2000

(51) Int. Cl.[7] .............................................. H01L 21/336
(52) U.S. Cl. ...................................... 438/305; 438/231
(58) Field of Search ................................ 438/231, 305, 438/528

(56) References Cited

U.S. PATENT DOCUMENTS

| | | | |
|---|---|---|---|
| 4,683,645 A | 8/1987 | Naguib et al. | |
| 4,697,333 A | * 10/1987 | Nakahara | ..................... 437/20 |
| 4,745,082 A | 5/1988 | Kwok | |
| 4,784,718 A | 11/1988 | Mitani et al. | |
| 4,954,867 A | 9/1990 | Hosaka | |
| 5,264,382 A | 11/1993 | Watanabe | |
| 5,374,575 A | 12/1994 | Kim et al. | |
| 5,391,510 A | 2/1995 | Hsu et al. | |
| 5,393,685 A | 2/1995 | Yoo et al. | |
| 5,429,956 A | 7/1995 | Shell et al. | |
| 5,478,776 A | 12/1995 | Luftman et al. | |
| 5,593,907 A | 1/1997 | Anjum et al. | |
| 5,607,884 A | 3/1997 | Byun | |
| 5,654,570 A | 8/1997 | Agnello | |
| 5,675,159 A | 10/1997 | Oku et al. | |
| 5,716,861 A | 2/1998 | Moslehi | |
| 5,753,958 A | * 5/1998 | Burr et al. | ................... 257/392 |
| 5,770,485 A | * 6/1998 | Gardner et al. | ............. 438/162 |
| 5,793,090 A | 8/1998 | Gardner et al. | |
| 5,811,323 A | 9/1998 | Miyasaka et al. | |
| 5,825,066 A | 10/1998 | Buynoski | |
| 5,856,225 A | 1/1999 | Lee et al. | |
| 5,858,843 A | 1/1999 | Doyle et al. | |
| 5,885,886 A | * 3/1999 | Lee | ............................. 438/305 |
| 5,915,182 A | 6/1999 | Wu | |
| 5,915,196 A | 6/1999 | Mineji | |
| 6,004,852 A | 12/1999 | Yeh et al. | |
| 6,008,111 A | 12/1999 | Fushida et al. | |
| 6,022,785 A | * 2/2000 | Yeh et al. | .................... 438/305 |
| 6,165,858 A | * 2/2000 | Gardner e tal. | ............. 438/305 |
| 6,037,204 A | 3/2000 | Chang et al. | |
| 6,114,211 A | * 9/2000 | Fulford et al. | ............... 438/305 |
| 6,133,082 A | * 10/2000 | Masuoka | ..................... 438/227 |
| 6,194,748 B1 | * 2/2001 | Yu | ............................. 257/216 |
| 6,204,138 B1 | * 3/2001 | Krishnan et al. | ............ 438/307 |
| 6,268,640 B1 | * 7/2001 | Park et al. | ................... 257/607 |
| 6,361,874 B1 | * 3/2002 | Yu | ............................. 428/514 |
| 6,365,476 B1 | * 4/2002 | Talwar et al. | ................ 438/301 |

FOREIGN PATENT DOCUMENTS

| | | | |
|---|---|---|---|
| JP | 3-248433 | 11/1991 | |
| JP | 4-123439 | 4/1992 | |
| JP | 5-160396 | 6/1993 | |
| JP | 10242848 A | * 9/1998 | ............. H03L/7/08 |

OTHER PUBLICATIONS

Stanley Wolf and Richard N. Tauber, Silicon Processing for the VLSI ERA, 1986, vol. 1, p. 290.*
"Sub–100nm Gate Length Metal Gate NMOS Transistors Fabricated by a Replacement Gate Process" by Chatterjee, et al. IEEE, Dec. 7–10, 1997.
"Sub–50nm Fin FET: PMOS" by Huang, et al., IEEE, 1999.
"Silicon Processing for the VLSI Era" by Wolf, et al., 1986.
"Ultra–Thin–Body Silicon–On–Insulator MOSFETS for Terabit–Scale Integration" by Yu, et al.

* cited by examiner

Primary Examiner—John F. Niebling
Assistant Examiner—Angel Roman
(74) Attorney, Agent, or Firm—Foley & Lardner

(57) ABSTRACT

A method of manufacturing an integrated circuit may include the steps of forming a deep amorphous region and doping the deep amorphous region. The doping of the deep amorphous region can form source and drain regions with extensions. After doping, the substrate is annealed. The annealing can occur at a low temperature. The deep amorphous region can be formed with a self-amorphizing implant.

20 Claims, 2 Drawing Sheets

SELF-AMORPHIZED REGIONS FOR TRANSISTORS

CROSS REFERENCE TO RELATED APPLICATIONS

This patent application is related to U.S. application Ser. No. 09/187,890, by Yu et al., entitled "A Method of Fabricating an Integrated Circuit with Ultra-Shallow Drain/Source Extensions"; and U.S. application Ser. No. 09/187,630, by Yu, entitled "Dual Amorphization Implant Process for Ultra-Shallow Drain and Source Extensions"; both filed on Nov. 6, 1998. In addition, this patent application is related to U.S. application Ser. No. 09/255,546, filed on Feb. 22, 1999, by Yu, entitled "A Locally Confined Deep Pocket Process for ULSI MOSFETS"; and U.S. application Ser. No. 09/384,121, by Yu, entitled "CMOS Transistors Fabricated in Optimized RTA Scheme", filed on Aug. 27, 1999. The present application is also related to U.S. application Ser. No. 09/633,207, by Yu, entitled "Solid Phase Epitaxy Activation Process for Source/Drain Junction Extensions and Halo Regions", filed on Aug. 7, 2000, application Ser. No. 09/597,623, and U.S. Ser. No. 09/599,270 filed on Jun. 22, 2000, by Yu, entitled "A Solid Phase Epitaxy Process for Manufacturing Transistors Having Silicon/Germanium Channel Regions" and U.S. Ser. No. 09/618,857 entitled "CMOS Manufacturing Process with Self-Amorphized Source/Drain Junctions and Extensions" filed by Yu on Jun. 18, 2000. All applications are assigned to the assignee of the present invention.

FIELD OF THE INVENTION

The present invention relates generally to the field of integrated circuits (ICs) and to methods of manufacturing integrated circuits. More particularly, the present invention relates to a method of manufacturing an integrated circuit including transistors with halo regions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETs) or MOSFETs. The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Thus, controlling short channel effects is important to assuring proper semiconductor operation.

Conventional IC fabrication techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacers.

As transistors disposed on integrated circuits (ICs) become smaller, transistors with shallow and ultra-shallow source/drain extensions have become more difficult to manufacture. For example, smaller transistors should have ultra-shallow source and drain extensions with less than 30 nanometer (nm) junction depth. Forming source and drain extensions with junction depths of less than 30 nm is very difficult using conventional fabrication techniques. Conventional ion implantation and diffusion-doping techniques make transistors on the IC susceptible to short-channeling effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate. One technique utilizes shallow pocket regions which effectively suppress the short-channel effect (which degrades the robustness of the transistor to random process variations). Shallow pocket regions are provided in a conventional CMOS pocket implant process. The implant process is performed after the gate structure is fabricated and before the silicide layers are formed. The shallow pocket regions are not deeper than the source and the drain regions.

Another channel doping technique utilizes a two-dimensional doping implant, which is achieved by forming deep pocket implant regions, wherein the channel-doping profile in the lateral direction is non-uniform and the channel-doping profile in the vertical direction is a super-steep retrograded channel-doping profile. The two-dimensional channel-doping profile is critical to scaling (i.e., proportional operation for the ultra-small dimensions of the MOSFET). The deep pocket implant regions are conventionally formed after the extensions, drain and source regions and spacers are formed. The deep pocket results in a "halo-like" structure (e.g., halo regions). It is desirous to maintain the halo regions in a localized portion of the substrate.

As the critical dimensions of transistors continue to be reduced (e.g., to achieve a gate length of 50 mn and below), control of thermal budget in IC fabrication is very important. The term 'thermal budget' refers to the temperature applied to the substrate during the fabrication process. The formation of ultra-shallow source/drain extensions and a super-localized halo profile for the halo regions is critical to control short-channel effects. In conventional CMOS processes, high temperature (e.g., greater than 1000° C.) rapid thermal annealing (RTA) is used to activate the dopant in the source region, drain region, halo region, etc. However, the high temperature RTA can adversely affect the formation of the source, drain and halo regions.

With continually-shrinking MOSFET dimensions, high-k materials (i.e., materials having a high dielectric constant or k, such as, $Al_2O_3$, $TiO_2$, $ZrO_2$, etc.) can also be used as gate insulators. High-k materials tend to react with silicon at high temperatures. As such, the processing temperature has to be kept low (e.g., <800° C.) if high-k materials are to be used as gate dielectrics. Accordingly, conventional CMOS processes cannot readily employ high-k gate dielectrics due to the adverse affects of the high temperature RTA.

Thus, there is a need for a manufacturing process for CMOS integrated circuits in which post-gate processing temperatures are lower such that high-k materials used as gate insulators do not react with silicon. Further, there is a need for a transistor fabrication process which uses a differential anneal strategy. Even further, there is a need for using an amorphous implant before the halo region, the shallow source/drain extensions and deep source/drain contact junctions are formed. Even further still, there is a need for an IC manufacturing process in which highly activated source/drain extensions, deep source/drain contact junctions and halo regions are created. Yet further, there is a need for an ultra-shallow source/drain extension and super localized halo region that can be economically fabricated.

SUMMARY OF THE INVENTION

An exemplary embodiment relates to a method of manufacturing a transistor. The method includes providing a gate structure, providing a self-amorphized halo implant, providing a shallow dopant implant, and forming a pair of spacers abutting the gate structure. The method also includes providing a self-amorphized deep source/drain dopant implant and annealing at a low temperature. The annealing at the low temperature activates dopants from the shallow extension dopant implant, the halo dopant implant, and the deep source/drain dopant implant via solid phase epitaxy.

Another exemplary embodiment relates to a process of forming a transistor on a substrate. The substrate includes a gate conductor. The process includes doping a halo region, forming a deep amorphous region, doping a shallow portion of the deep amorphous region, and doping deep source and drain regions. The method also includes recrystallizing the deep amorphous region. The shallow portion is doped for shallow source/drain extensions.

Yet another embodiment relates to a method of manufacturing a transistor on an ultra-large scale integrated circuit. The method includes steps of amorphizing a halo region in a substrate with a halo dopant implant, implanting a dopant into a shallow portion of the halo amorphous region of the substrate to form a source extension and a drain extension, implanting a dopant into a deep portion of the substrate to form a deep source and drain region, and recrystallizing the halo amorphous region.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
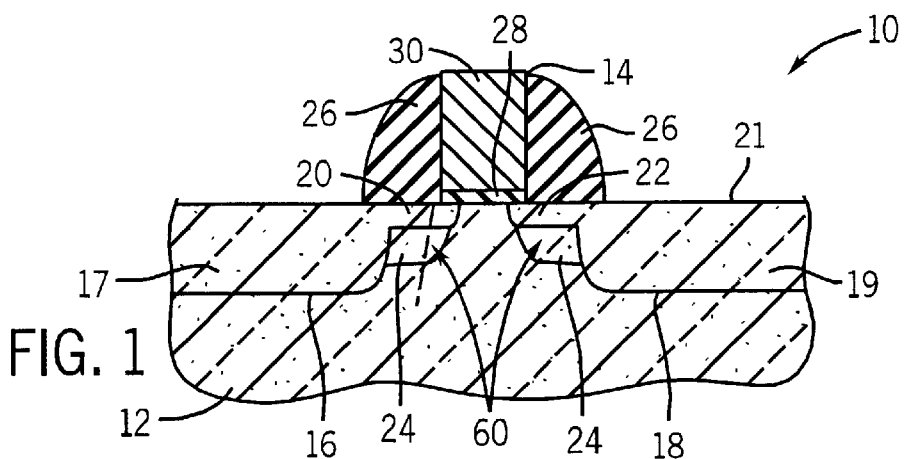
FIG. 1 is a cross-sectional view of a portion of an integrated circuit fabricated in accordance with an exemplary embodiment of the present invention.

Referring to FIG. 1, a portion 10 of an integrated circuit (IC) or chip includes a substrate 12, a gate stack 14, a source region 16, a drain region 18, and halo regions 24. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is any of a variety of semiconductor materials, such as, silicon. Substrate 12 is preferably a bulk P-type substrate or a silicon-on-insulator substrate. Substrate 12 can be single crystal silicon oriented in a 100 direction.

In an exemplary embodiment, gate stack 14 includes a polysilicon gate electrode or conductor 30 disposed over a gate dielectric or insulator 28, such as thermally grown silicon dioxide. Gate stack 14 is aligned between active regions in substrate 12. Active regions are areas in portion 10 including impurities or dopants such as a p-type dopant (e.g., boron) or an n-type dopant (e.g., phosphorous). Gate stack 14 is located between spacers 26. Spacers 26 are preferably silicon dioxide ($SiO_2$) structures which abut lateral sides of gate structure or stack 14 and are provided at least partially over source region 16 and drain region 18.

Source region 16 and drain region 18 are formed by ion implantation and include a source extension 20, a drain extension 22, a deep source region 17 and a deep drain region 19. Halo regions 24 are located below extensions 20 and 22. The dopants in halo regions 24, source region 16 and drain region 18 are advantageously activated by thermal activation or annealing in a low thermal budget process as described below with reference to FIGS. 1–4.

Source extension 20 is a shallower extension of source region 16. Drain extension 22 is a shallower extension of drain region 18. Preferably, source extension 20 and drain extension 22 extend at least partially below gate stack 14. In one embodiment, these extensions are 20–40 nm deep (e.g., below a top surface 21 of substrate 12) and the width of each extension region is 30–50 Å. In one embodiment, deep source/drain regions 17 and 19 are 50–100 nm deep.

The dopants for regions 16 and 18 can be phosphorous (P), arsenic (As) or antimony (Sb) for an n-channel MOSFET and boron (B), or boron diflouride ($BF_2$) for a p-channel MOSFET. Preferably, regions 17 and 19 can have a concentration of $1 \times 10^{19}$ to $1 \times 10^{21}$ dopants per cubic centimeter and are doped with As, Sb, or $BF_2$.

Halo regions 24 share a border with extensions 20 and 22 and regions 17 and 19. Halo regions 24 can extend 40–80 nm below top surface 21 of substrate 12. Regions 24 preferably have a concentration of $1 \times 10^{18}$–$5 \times 10^{18}$ dopants per cubic centimeter.

The profile of regions 24 is preferably super localized. The dopants for regions 24 can be P, As, or Sb for p-channel MOSFETs and B or $BF_2$ for n-channel MOSFETs. Preferably, regions 24 are doped with As, B, or $BF_2$. The dopants in regions 24 have an opposite conductivity type to that of regions 16 and 18.

A very low or low temperature (e.g., 500–600° C.) rapid thermal anneal (RTA) or furnace anneal is used to activate the dopants in deep source region 17, deep drain region 19, halo regions 24, source extension 20, and drain extension 22. The very low temperature can activate the dopants because source 16, drain 18 and halo regions 24 are provided in amorphous regions associated with the self-amorphized halo dopant implant and self-amorphized deep source/drain dopant implant discussed below.

The very low temperature (e.g., 500–600° C.) anneal is enough to recrystallize the source region 16 and drain region 18 including extensions 20 and 22 as well as region 24. Dopant inside the regions 16 and 18 and 20 and 22 as well as region 24 become well activated due to the mechanism of solid-phase epitaxy. By using a low thermal budget, steep source/drain junctions and a steeper localized halo profile can be obtained, which is desirable for transistors with small dimensions.

The method of forming portion 10 is described below with reference to FIGS. 1–5. The method advantageously forms portion 10 including deep source/drain regions 17 and 19, extensions 20 and 22, and halo regions 24 with high dopant activation. High activation is achieved via solid phase epitaxy.

The method described with reference to FIGS. 1–5 also advantageously forms portion 10 including self-amorphized source/drain junctions and pocket or halo regions. Self-amorphization means that without using the traditional species for an amorphization implant (e.g., Si, Ge), the dopant itself (e.g., Sb, As, etc.) can create an amorphous region during implantation. When the dopant mass is heavy enough, it rearranges the crystalline structure of the silicon substrate during the implantation, leaving an amorphous layer in the silicon substrate.

Figure 2:
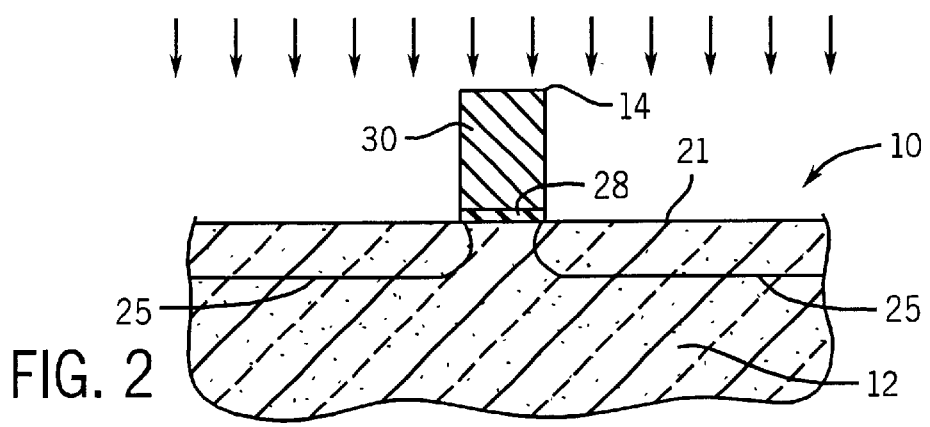
FIG. 2 is a cross-sectional view of the portion of the integrated circuit illustrated in FIG. 1, showing a self-amorphization halo dopant implant step.

In FIG. 2, a cross-sectional view of portion 10 illustrates substrate 12 after a conventional CMOS fabrication process is followed to form a gate stack 14 including gate insulator 28 and gate conductor 30. Conductor 30 can be polysilicon or polysilicon germanium material. The polysilicon material can be undoped or doped to be highly conductive. Alternatively, conductor 36 can be a metal material.

Conductor 30 can be deposited by chemical vapor deposition (CVD), and insulator 28 can be thermally grown silicon dioxide. Preferably, conductor 30 is 1,000–2,000 Å thick undoped polysilicon material and is 35–150 mn wide. Insulator 28 is 35–150 nm wide and 15–30 Å thick. Insulator 28 can be silicon dioxide, nitride, or a high-k dielectric material.

After conductor 30 is provided, a self-amorphizing halo dopant implant forms deep amorphous regions 25 in substrate 12. Regions 25 preferably extend 40–80 nm below top surface 21 of substrate 12 and are exclusive of an area underneath structure 14. Regions 25 partially correspond to regions 24 (FIG. 1).

Various doping processes can be utilized to form regions 25. Preferably, an ion implantation process utilizes a dopant, such as, Sb, As, or $BF_2$, rather than a neutral ion, such as, silicon (Si), germanium (Ge), and/or xenon (Xe), forms region 25. Preferably, Sb ions are accelerated to an energy at a medium dose (e.g., $5\times10^{14}$–$1\times10^{16}$ dopants per cm$^2$) to form regions 25 for a P-channel transistor ($BF_2$ for an N-channel transistor). Ion implantation devices, such as, devices manufactured by Varian Company, Palo Alto, Calif., Genius Company, and Applied Materials, Inc. can be used to provide the self-amorphized halo dopant implant as well as the dopant implants discussed below. The Sb ions (for a P-channel transistor) change the single crystal structure of substrate 12 into an amorphous structure for regions 25. Subsequent doping of substrate 12 for extensions 20 and 22 (FIG. 1) and regions 24 are confined to regions 25.

In an exemplary embodiment, heavy dopants, such as, $BF_2$, As, or Sb are used. Due to the high dose of dopants, regions 25 become self-amorphized. Self-amorphization occurs because heavy mass dopants displace silicon atoms in substrate 12. Amorphization allows dopants to be activated at lower temperatures. In an exemplary embodiment, regions 25 correspond to regions 24 (FIG. 1) and have a depth of 40–80 nm below surface 21. Alternatively, a tilted implant can be utilized to provide dopants partially underneath conductor 30.

Conductor 30 can also be amorphized when regions 25 are formed. Alternatively, a cap material such as silicon nitride or silicon oxynitride can be provided above conductor 30 to protect it during the halo dopant implant.

Figure 3:
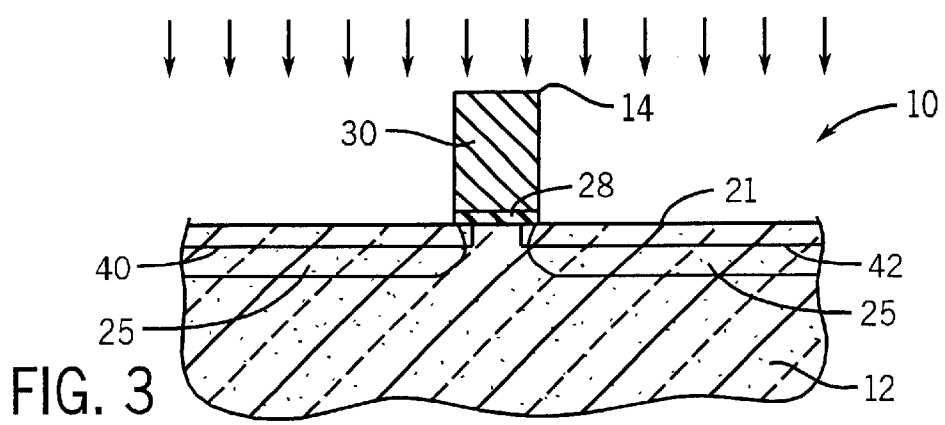
FIG. 3 is a cross-sectional view of the portion of the integrated circuit illustrated in FIG. 2, showing a shallow source/drain extension dopant implant step.

In FIG. 3, portion 10 includes shallow source extension layer 40 and shallow drain extension 42 that are formed via a source/drain extension dopant implant. Layers 40 and 42 located above regions 25 in FIG. 3 and correspond to extensions 20 and 22 (FIG. 1). The source/drain extension dopant implant is projected to a center depth of 10–15 nm below top surface 21 and layers 40 and 42 are 20–30 Å deep. The source/drain extension dopant implant can be a self-amorphizing implant or a non-self-amorphizing implant. In an exemplary embodiment, a heavy dose of non-neutral dopants, such as, P, B, $BF_2$, As, or Sb are used.

Shallow source/drain extension layers 40 and 42 have a concentration of $1\times10^{19}$ to $1\times10^{21}$ dopants per cubic centimeter. The source/drain extension dopant implant can be performed at a dose of $1\times10^{14}$–$1\times10^{15}$ cm$^{-2}$ at energies of 1–5 KeV Layers 40 and 42 are contained within region 25.

Conductor 30 can be covered by a cap material such as silicon nitride or silicon oxynitride to protect conductor 30 from the implantation of ions for layers 40 and 42. Alternatively, conductor 30 can be doped during the formation of layers 40 and 42.

Figure 4:
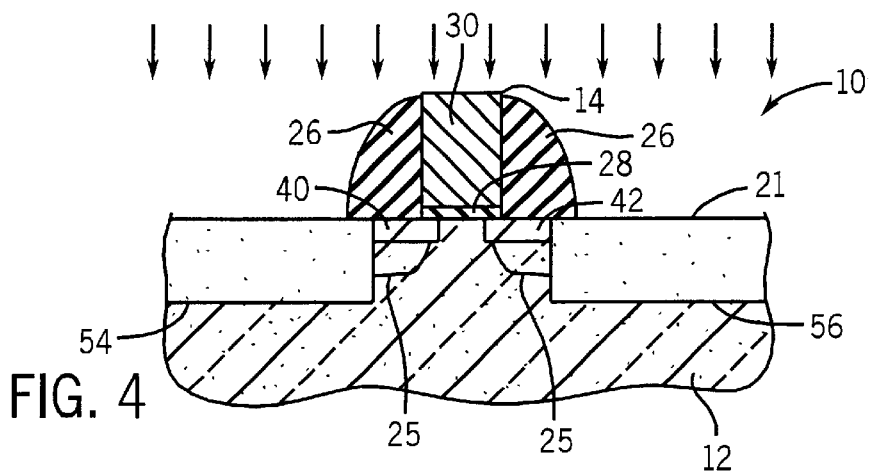
FIG. 4 is a cross-sectional view of the portion of the integrated circuit illustrated in FIG. 3, showing a spacer formation step and a self-amorphizing deep source/drain dopant implant step.

In FIG. 4, dielectric spacers 26 are formed by plasma enhanced chemical vapor deposition (PECVD) and etch-back processes. The PECVD process is preferably a very low temperature (less than 400° C.) deposition process. Spacers 26 can be an oxide or nitride material. The low temperature deposition technique does not change the amorphous structure of region 25.

In FIG. 4, a self-amorphizing deep source/drain dopant implant is provided at a dose of $1\times10^{15}$–$1\times10^{16}$ cm$^{-2}$ and energies of 10–100 KeV to form deep source/drain layers 54 and 56. Similar to regions 25, layers 54 and 56 are formed by a self-amorphizing implant. Preferably, dopants having the same conductivity type used for extensions 20 and 22 and having an opposite conductivity type for regions 25 are used. Preferably, As or Sb is utilized for an N-channel transistor ($BF_2$ for a P-channel transistor). Deep source/drain layers 54 and 56 are shown in FIG. 4 as stippled areas and correspond to regions 17 and 19 (FIG. 1). In one embodiment, non-neutral dopants, such as, P, $BF_2$, As, or Sb, can be used. The dopants can be charged to an energy level of 10–100 KeV to implant layers 54 and 56.

The self-amorphizing deep source/drain dopant implant in FIG. 4 is formed in a heavy dose and is deeper than the halo dopant implant (FIG. 2) and the shallow source/drain extension implant (FIG. 3). In an exemplary embodiment, the depth of this deep source/drain dopant implant has a depth of 50–100 nm. Conductor 30 can also be doped during this step.

In FIG. 1, shallow source and drain extensions 20 and 22 (layers 40 and 42) (FIG. 4), deep source and drain regions 17 and 19 (layers 54 and 56 in FIG. 4) halo regions 24 (layers 50 and 52) (FIG. 4) are annealed to activate the dopant and to recrystallize region 25. The annealing process changes the structure of regions 25 from an amorphous state to a single crystalline state (e.g., melts regions 25 which subsequently recrystallize). Preferably, a solid phase epitaxy technique is utilized to crystallize regions 25. Solid phase epitaxy refers to a crystallization process by which an amorphous semiconductor film (silicon, silicon/germanium, or germanium) is converted into crystalline semiconductor (silicon, silicon/germanium, or germanium) of a single orientation matching the orientation of an existing crystalline semiconductor (silicon, silicon/germanium, or germanium) start layer. Solid phase epitaxy is usually achieved by heating the amorphous silicon. Preferably, a very low temperature (e.g., 500–600° C. furnace) rapid thermal anneal (RTA) is utilized. Substrate 12 acts as a seed or start layer for recrystallization of regions 25 and layers 54 and 56. Preferably, the solid phase epitaxy is performed at a very low temperature so that the thermal budget of the process is not adversely affected.

As described above, the very low temperature (e.g., 500–600° C.) RTA is preferable applied to recrystallize deep amorphous region 25 (layers 40, 42, 50 52, 54 and 56) and form regions 16, 18, 20, 22, and 24 (FIG. 1). In one embodiment, a solid-phase epitaxy process occurs in which the dopants in deep source and drain regions 17 and 19 (layers 54 and 56) (FIG. 4), halo regions 24 (regions 25 in FIG. 2) and shallow source and drain extensions 20 and 22 (layers 40 and 42 in FIG. 3) achieve high activation (e.g., 80–100 percent of dopants, substantially all of the dopants). The portion of activated dopants in regions 25 below extensions 20 and 22 acts as a blocker on halo regions 24.

Conventional CMOS fabrication process steps can complete the manufacturing of the IC. In one embodiment, conductor 30 can also be recrystallized during the annealing steps and dopants in conductor 30 can be highly activated.

The process described with reference to FIGS. 1–4 is particularly advantageous in light of the need for smaller integrated circuits. As smaller MOSFETs are designed, high-k materials, such as, $Al_2O_3$, $TiO_2$, and $ZrO_2$ are used as the gate insulator. Unfortunately, high-k materials react with silicon at high temperatures. As such, lower temperatures must be used. In an exemplary embodiment of the circuit fabrication process described above, the reaction of high-k materials with high temperatures is avoided by the use of self-amorphized regions or layers region and solid phase epitaxy process.

Figure 5:
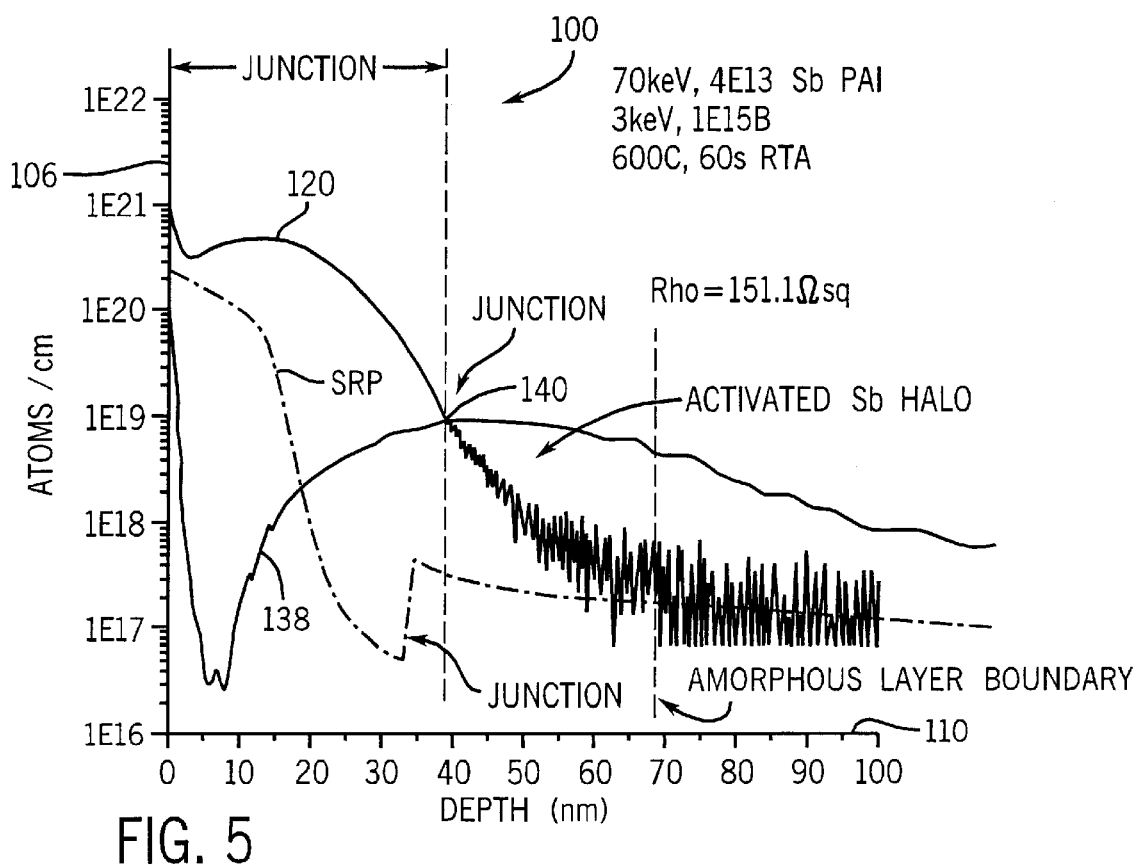
FIG. 5 is a graph including a dopant concentration axis (y-axis) and a depth axis (x-axis) for the portion of the integrated circuit illustrated in FIG. 1, the graph representing a Secondary Ion Mass Spectrometry (SIMS) profile across a depth marked by a dashed line 60 in FIG. 1.

With reference to FIG. 5, a graph 100 shows concentration of dopants along a dashed line 60 of portion 10 (FIG. 1). Graph 100 includes a y-axis 106 indicating concentration in atoms per centimeter cubed. Graph 100 includes an x-axis 110 showing depth below top surface 21 of substrate 12 in nanometers.

FIG. 5 represents the Secondary Ion Mass Spectrometry (SIMS) profile for portion 10 after the source/drain extension dopant implant and before the deep source/drain dopant implant. In FIG. 5, the halo dopant implant utilizes Sb at 70 KeV and a dose $4 \times 10^3$ atoms per centimeter squared. The source/drain extension dopant implant utilizes B at 3 KeV and a dose of $1 \times 10^{15}$ atoms per centimeter squared.

As can be seen in FIG. 5, the concentration of B represented by a line 120 is relatively high from a depth of zero to 40 nm along line 60 (FIG. 1). In an exemplary embodiment, the concentration of B is between $1 \times 10^{19}$–$1 \times 10^{21}$ dopants per centimeter cubed at depths of zero to 40 nm (the extensions 20 and 22). The level of dopants represented by line 120 falls to less than $1 \times 10^{18}$ dopants per centimeter cubed as depths below 40 nm are reached.

A line 138 represents the concentration of dopants associated with halo region 24 (e.g., Sb). As shown by line 138, the concentration of Sb is maximized from a depth of 40 to 70 nm. At depths of below 10 nm, a minimum concentration of dopants is achieved.

At a point 140 where lines 120 and 138 intersect, the concentration of Sb and B is equal at a depth of 40 nm. Point 140 represents a transition from extensions 20 and 22 to regions 24. Therefore, graph 100 shows the localized nature of regions 24 as well as the formation of shallow source and drain extensions.

While the embodiments illustrated in the FIGURES and described above are presently preferred, it should be understood that these embodiments are offered by way of example only. Other embodiments may include, for example, different techniques for selectively annealing various integrated circuit structures. The invention is not limited to a particular embodiment, but extends to various modifications, combinations, and permutations that nevertheless fall within the scope and spirit of the appended claims.

What is claimed is:

1. A method of manufacturing a transistor, the method comprising:

providing a gate structure;

providing a self-amorphized halo dopant implant;

providing a shallow extension dopant implant;

forming a pair of spacers abutting the gate structure;

providing a self-amorphized deep source/drain dopant implant; and annealing at a low temperature, the annealing activating dopants from the shallow extension dopant implant, the halo dopant implant, and the deep source/drain dopant implant via solid phase epitaxy.

2. The method of claim 1, wherein the halo dopant implant is performed at a dose of $5 \times 10^{14}$–$1 \times 10^{16}$ dopants per square centimeter and creates an amorphous region at least 40–80 nm deep.

3. The method of claim 1, wherein the halo implant utilizes Sb ions at a medium dose and extends 40–80 nm below a top surface of a substrate and the self-amorphized deep source/drain dopant implant utilizes As ions at a heavy dose and extends 50–100 nm below the top surface.

4. The method of claim 1, the gate structure comprises a high-k gate dielectric insulator and the annealing step is at a temperature between 500–600 degrees C.

5. The method of claim 1, wherein the shallow extension dopant implant has a center projected to a depth of 10–15 Å deep.

6. The method of claim 5, wherein the step of annealing is at a temperature below 600° C.

7. The method of claim 6, wherein the temperature is at least between approximately 500° C. and 600° C.

8. The method of claim 1, wherein the shallow extension dopant implant utilizes antimony, boron diflouride, or arsenic.

9. A process of forming a transistor on a substrate, the substrate including a gate conductor, the process comprising:

doping a halo region and simultaneously forming a deep amorphous region;

doping a shallow portion of the deep amorphous region for shallow source and drain extensions;

doping deep source and drain regions in a self-amorphizing process; and recrystallizing the deep amorphous region in a low temperature process.

10. The process of claim 9, wherein the step of recrystallizing occurs at a temperature between 500–600 degrees C and the gate conductor is above a high-k insulator.

11. The process of claim 9, wherein the self-amorphizing process utilizes Sb ions at a heavy dose and the halo region is doped utilizing As ions at a medium dose.

12. The process of claim 11, wherein the doping the halo region utilizes a dose of $5 \times 10^{14} - 1 \times 10^{16}$ dopants per square centimeter.

13. The process of claim 11, wherein the doping the deep source and drain regions provides the Sb ions to a depth of 50–100 nm.

14. A method of manufacturing a transistor on an ultralarge scale integrated circuit, the method comprising the steps of:

providing a gate structure having a high-k gate dielectric;

amorphizing a halo region in a substrate with a medium dose halo dopant implant including one of Sb or As;

implanting an amorphizing dopant at a heavy dose into a shallow portion of the halo region of the substrate to form source and drain extensions;

implanting with a self amorphizing implant a dopant into a deep portion of the substrate to form deep source and drain regions, the dopant for the deep source and drain regions including Sb if As is used in the amorphizing step and including As if Sb is used in the amorphizing step; and recrystallizing the halo region in a low temperature process between 500–600°C.

15. The method of claim 14, wherein the implanting a dopant into a deep portion amorphizes to a depth of 50–100 nm in the substrate.

16. The method of claim 14, wherein the halo dopant implant is a medium dose antimony implant.

17. The method of claim 14, wherein recrystallizing comprises applying a rapid thermal anneal between approximately 500° and 600° C.

18. The method of claim 14, wherein the recrystallizing step is a solid phase epitaxy step.

19. The method of claim 18, wherein the amorphizing step utilizes a dose between $5 \times 10^{14}$ dopants per square centimeter and $1 \times 10^{16}$ dopants per square centimeter.

20. The method of claim 14, wherein the gate insulator is provided above the substrate wherein the gate insulator is any one of $Al_2O_3$, $TiO_2$, and $ZrO_2$.

* * * * *